US008980138B2

(12) United States Patent
Inoue

(10) Patent No.: US 8,980,138 B2
(45) Date of Patent: Mar. 17, 2015

(54) CONDUCTIVE COMPOSITION, CONDUCTIVE COMPOSITION SHEET, CONDUCTIVE SUBSTRATE, COLLECTOR SHEET, PRINTED CIRCUIT BOARD, FUEL CELL AND METHOD OF MANUFACTURING THE CONDUCTIVE COMPOSITION

(71) Applicant: Nitto Denko Corporation, Ibaraki-shi, Osaka (JP)

(72) Inventor: Shinichi Inoue, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 172 days.

(21) Appl. No.: 13/760,264

(22) Filed: Feb. 6, 2013

(65) Prior Publication Data

US 2013/0209918 A1    Aug. 15, 2013

(30) Foreign Application Priority Data

Feb. 10, 2012    (JP) .................................. 2012-027544

(51) Int. Cl.
*H01B 1/06*   (2006.01)
*H05K 1/09*   (2006.01)
*B32B 5/16*   (2006.01)
*H01M 4/64*   (2006.01)
*C04B 35/00*  (2006.01)
*H01M 4/66*   (2006.01)
*H01B 1/04*   (2006.01)
*H01M 8/02*   (2006.01)

(52) U.S. Cl.
CPC ................ *H01M 4/666* (2013.01); *H01B 1/04* (2013.01); *H05K 1/092* (2013.01); *H05K 1/095* (2013.01); *H01M 8/0228* (2013.01); *H01M 8/0247* (2013.01); *H01M 8/0269* (2013.01); *H01M 8/0206* (2013.01); *H01M 8/0226* (2013.01); *Y02E 60/50* (2013.01)
USPC ........... 252/511; 264/105; 174/257; 428/323; 429/520

(58) Field of Classification Search
None
See application file for complete search history.

(56) References Cited

U.S. PATENT DOCUMENTS

| 8,715,533 B2 * | 5/2014 | Takagi et al. ................. 252/511 |
| 2005/0123822 A1 | 6/2005 | Ishikawa et al. |
| 2010/0047653 A1 | 2/2010 | Yamazaki et al. |
| 2010/0129695 A1 * | 5/2010 | Im et al. .......................... 429/34 |
| 2012/0307501 A1 * | 12/2012 | Tankala et al. ................ 362/294 |

FOREIGN PATENT DOCUMENTS

| JP | 08031231 A * | 2/1996 | ............... H01B 1/24 |
| JP | 2001-052721 A | 2/2001 | |
| JP | 2005-108616 A | 4/2005 | |
| JP | 2010-050378 A | 3/2010 | |

* cited by examiner

*Primary Examiner* — Harold Pyon
*Assistant Examiner* — Jaison Thomas
(74) *Attorney, Agent, or Firm* — Panitch Schwarze Belisar & Nadel LLP

(57) ABSTRACT

A mixture of spherical graphite, carbon black and binder resin is fabricated. The mixture contains the spherical graphite of not less than 50 parts by weight and not more than 70 parts by weight, the carbon black of not less than 1 part by weight and not more than 15 parts by weight and the binder resin of not less than 15 parts by weight and not more than 40 parts by weight, to 100 parts by weight of the mixture. The binder resin includes thermosetting resin and elastomer, and an average particle diameter of the spherical graphite is not less than 1 μm and not more than 30 μm. The conductive composition including the mixture can be used for a collector such as a fuel cell.

12 Claims, 6 Drawing Sheets

CONDUCTIVE COMPOSITION, CONDUCTIVE COMPOSITION SHEET, CONDUCTIVE SUBSTRATE, COLLECTOR SHEET, PRINTED CIRCUIT BOARD, FUEL CELL AND METHOD OF MANUFACTURING THE CONDUCTIVE COMPOSITION

BACKGROUND OF THE INVENTION (1) Field of the Invention

The present invention relates to a conductive composition, a conductive composition sheet, a conductive substrate, a collector sheet, a printed circuit board, a fuel cell and a method of manufacturing the conductive composition.

(2) Description of Related Art

Batteries that are small in size and have high capacitance are desired for mobile equipment such as cellular telephones. Therefore, fuel cells capable of providing high energy density compared to conventional batteries such as lithium secondary batteries have been developed. Examples of the fuel cells include a direct methanol fuel cell.

In the direct methanol fuel cell, methanol is decomposed by a catalyst, forming hydrogen ions. The hydrogen ions are reacted with oxygen in the air to generate electrical power. In this case, chemical energy can be converted into electrical energy with extremely high efficiency, so that a significantly high energy density can be obtained.

BRIEF SUMMARY OF THE INVENTION

In a direct methanol fuel cell described in JP 2010-50378 A, an electrode film composed of a fuel electrode, an air electrode and an electrolyte electrode is arranged between portions of a bent flexible printed circuit. In the flexible printed circuit board, conductor layers having predetermined patterns are formed on a base insulating layer as collector portions. Each conductor layer is covered with a carbon containing layer. The carbon containing layer is made of a resin composition including carbon black, for example and has the electrical conductivity. The electrical conductivity of the carbon containing layer is required to be improved in order to smoothly move electrons between the electrode film and each conductor layer.

A conductive resin composition described in JP 2001-052721 A includes coarse particles of graphite, spherical graphite and non-carbonaceous resin. The coarse particles of graphite has an average particle diameter of not less than 40 µm and not more than 120 µm, and the spherical graphite has a smaller average particle diameter than the average particle diameter of the coarse particles of graphite. A fuel cell separator is fabricated using the conductive resin composition. Thus, the electrical conductivity of the fuel cell separator is improved. If the average particle diameter of the coarse particles of graphite is large as described above, however, it is difficult to obtain the conductive resin composition having a smaller thickness. In this case, the size of the fuel cell increases.

A conductive resin composition described in JP 2005-108616 A includes thermosetting resin, conductive filler, spherical filler and carbon fiber, and is used for a fuel cell separator. It is mentioned in JP 2005-108616 A that the particle diameter of the spherical filler is set in accordance with the thickness of the separator. Thus, the fuel cell separator having a smaller thickness can be obtained. In the conductive resin composition, however, only the thermosetting resin is used as a binder for the spherical filler and the like. In this case, the conductive resin composition is formed by curing the liquid thermosetting resin. The conductive resin composition after forming is not flexible. Therefore, the handleability of the conductive resin composition is not good.

An object of the present invention is to provide a conductive composition, a conductive composition sheet, a conductive substrate, a collector sheet, a printed circuit board and a fuel cell of which thickness can be reduced and electrical conductivity and handleability can be improved, and a method of manufacturing the conductive composition.

(1) According to one aspect of the present invention, a conductive composition includes a mixture of spherical graphite, carbon black and binder resin, wherein the mixture contains the spherical graphite of not less than 50 parts by weight and not more than 70 parts by weight, the carbon black of not less than 1 part by weight and not more than 15 parts by weight and the binder resin of not less than 15 parts by weight and not more than 40 parts by weight, to 100 parts by weight of the mixture, and the binder resin includes thermosetting resin and elastomer, and an average particle diameter of the spherical graphite is not less than 1 µm and not more than 30 µm.

The conductive composition contains the spherical graphite of not less than 50 parts by weight and not more than 70 parts by weight, the carbon black of not less than 1 part by weight and not more than 15 parts by weight. Further, the average particle diameter of the spherical graphite is not less than 1 µm and not more than 30 µm.

In this case, the carbon black is filled in high density among particles of the spherical graphite. Therefore, the density of the conductive composition is high and the surface of the conductive composition is smooth. Thus, the conductive composition having a smaller thickness can be obtained. Further, resistance among particles of the spherical graphite becomes small because of the carbon black, and thus the electrical conductivity of the conductive composition is improved.

Further, the conductive composition contains the binder resin of not less than 15 parts by weight and not more than 40 parts by weight, and the spherical graphite and the carbon black are bound by the binder resin. The binder resin includes the thermosetting resin and the elastomer. Therefore, the spherical graphite and the carbon black are bound by the elastomer having flexibility before the thermosetting resin is cured. Therefore, the conductive composition can be easily formed into a desired shape while the thermosetting resin is not cured. Thereafter, the thermosetting resin is cured, so that the shape of the conductive composition before being cured is maintained. Thus, the handleability of the conductive composition is improved.

As a result, the conductive composition having a smaller thickness can be obtained and the electrical conductivity and the handleability of the conductive composition is improved.

(2) The binder resin may contain the thermosetting resin of not less than 5 parts by weight and not more than 95 parts by weight and the elastomer of not less than 1 part by weight and not more than 90 parts by weight, to 100 parts by weight of the binder resin.

In general, the thermosetting resin after being cured has higher heat resistance than the heat resistance of the elastomer. Because the content of the thermosetting resin is not less than 5 parts by weight and the content of the elastomer is not more than 90 parts by weight, to 100 parts by weight of the binder resin, a sufficient amount of the thermosetting resin can be cured. Thus, even if the temperature of the environment is higher than the heat resistant temperature of the elastomer, the cured thermosetting resin keeps the shape of the conductive composition before being cured.

Further, because the content of the thermosetting resin is not more than 95 parts by weight and the content of the elastomer is not less than 1 part by weight, the spherical graphite and the carbon black are reliably bound by the elastomer before the thermosetting resin is cured. Thus, the conductive composition can be more easily formed into the desired shape while the thermosetting resin is not cured.

(3) The thermosetting resin may include at least one of epoxy resin and phenol resin.

In this case, better chemical resistance of the conductive composition is obtained. Further, even after the epoxy resin and the phenol resin are cured, the flexibility of the conductive composition can be maintained.

(4) According to another aspect of the present invention, a conductive substrate includes a metal layer, and a layer that is formed on at least one surface of the metal layer and is made of the conductive composition described above.

The conductive substrate includes the layer made of the conductive composition described above of which the thickness can be reduced. Therefore, the conductive substrate having a smaller thickness can be obtained.

Further, in the conductive substrate, the layer made of the conductive composition is formed on at least one surface of the metal layer. Before thermosetting resin is cured, the conductive composition is flexible and adhesive because of elastomer. Therefore, the metal layer can be easily attached to a desired member with the layer made of the conductive composition sandwiched therebetween while the thermosetting resin is not cured. Thereafter, the thermosetting resin is cured, so that the metal layer and the layer made of the conductive composition can be easily fixed to the member.

Further, at least one surface of the metal layer is covered with the layer made of the conductive composition. Thus, at least one surface of the metal layer is prevented from corroding.

(5) According to yet another aspect of the present invention, a conductive composition sheet is formed of the conductive composition described above.

The conductive composition sheet includes the conductive composition described above of which the thickness can be reduced. Therefore, the conductive composition sheet having a smaller thickness can be obtained.

In the conductive composition sheet, the electrical conductivity of the conductive composition is improved because of spherical graphite and carbon black. The conductive composition contains a larger amount of the spherical graphite than the carbon black. In each particle of the spherical graphite, the resistance anisotropy is small. Thus, even if each particle of the carbon black has the resistance anisotropy, the resistance anisotropy of the conductive composition sheet is reduced due to a larger amount of the spherical graphite than the carbon black. As a result, the sufficient electrical conductivity in the thickness direction is ensured in the conductive composition sheet.

Before thermosetting resin is cured, the conductive composition sheet is flexible and adhesive because of elastomer. Therefore, the conductive composition sheet can be easily attached to a desired member while the thermosetting resin is not cured. Thereafter, the thermosetting resin is cured, so that the conductive composition sheet can be easily fixed to the member. Thus, the handleability of the conductive composition sheet is improved.

(6) According to yet another aspect of the present invention, a conductive substrate includes a metal layer and the conductive composition sheet described above that is formed on at least one surface of the metal layer.

The conductive substrate includes the conductive composition sheet described above of which the thickness can be reduced. Therefore, the conductive substrate having a smaller thickness can be obtained.

Further, the conductive composition sheet is formed on at least one surface of the metal layer in the conductive substrate. Before thermosetting resin is cured, the conductive composition sheet is flexible and adhesive because of elastomer. Therefore, the metal layer can be easily attached to a desired member with the conductive composition sheet sandwiched therebetween while the thermosetting resin is not cured. Thereafter, the thermosetting resin is cured, so that the metal layer and the conductive composition sheet can be easily fixed to the member.

Further, at least one surface of the metal layer is covered with the conductive composition sheet. Thus, at least one surface of the metal layer is prevented from corroding.

(7) According to yet another aspect of the present invention, a collector sheet includes a metal layer having a predetermined pattern, and the conductive composition sheet described above that is formed on at least one surface of the metal layer.

The collector sheet includes the conductive composition sheet described above of which the thickness can be reduced. Therefore, the collector sheet having a smaller thickness can be obtained. Further, the conductive composition sheet is formed on at least one surface of the metal layer in the collector sheet. Because the conductive composition sheet has the excellent electrical conductivity, a loss of electrical energy in the conductive composition sheet is reduced even when the power collection by the metal layer is performed through the conductive composition sheet. Further, the conductive composition sheet has the excellent handleability. Therefore, the collector sheet can be easily fabricated.

(8) According to yet another aspect of the present invention, a printed circuit board includes an insulating layer, a conductor layer that is formed on the insulating layer and has a predetermined pattern and a cover layer that is formed so as to cover at least part of a surface of the conductor layer, wherein the cover layer includes the conductive composition sheet described above.

The printed circuit board includes the conductive composition sheet described above of which the thickness can be reduced. Therefore, the printed circuit board having a smaller thickness can be obtained. Further, the cover layer is formed so as to cover at least part of the conductor layer in the printed circuit board. The cover layer includes the conductive composition sheet described above. Because the conductive composition sheet has the excellent electrical conductivity, a loss of electrical energy in the conductive composition sheet is reduced even when the power collection by the conductor layer is performed through the conductive composition sheet. Furthermore, the conductive composition sheet has the excellent handleability. Therefore, the printed circuit board can be easily fabricated.

(9) According to yet another aspect of the present invention, a fuel cell includes the collector sheet described above, a cell element, a casing that stores the collector sheet and the cell element, wherein the collector sheet has an opening.

The fuel cell includes the collector sheet described above. The collector sheet has the opening. The collector sheet is provided on the cell element of the fuel cell such that fuel or air can be supplied to the cell element through the opening of the collector sheet. Therefore, electrons move between the cell element and the metal layer through the conductive composition sheet. The conductive composition sheet has the excellent electrical conductivity. Therefore, a loss of electrical energy in the conductive composition sheet is reduced during the power collection. As a result, the fuel cell with high efficiency can be obtained. Further, the collector sheet described above having a smaller thickness can be obtained. Therefore, the fuel cell having a smaller thickness is realized. Furthermore, the collector sheet has the excellent handleability. Thus, the fuel cell can be easily fabricated using the collector sheet.

(10) According to yet another aspect of the present invention, a fuel cell includes the printed circuit board described above, a cell element and a casing that stores the printed circuit board and the cell element, wherein the printed circuit board has an opening.

The fuel cell includes the printed circuit board described above. The printed circuit board has the opening. The printed circuit board is provided on the cell element such that fuel or air can be supplied to the cell element through the opening of the printed circuit board. Thus, electrons move between the cell element and the conductor layer through the conductive composition sheet. The conductive composition sheet has the excellent electrical conductivity. Therefore, a loss of electrical energy in the conductive composition sheet is reduced during the power collection. As a result, the fuel cell with high efficiency can be obtained. Further, the printed circuit board described above having a smaller thickness can be obtained. Therefore, the fuel cell having a smaller thickness is realized. Furthermore, the printed circuit board has the excellent handleability. Thus, the fuel cell can be easily fabricated using the printed circuit board.

(11) According to yet another aspect of the present invention, a method of manufacturing a conductive composition using a mixture that includes spherical graphite includes the steps of producing 100 parts by weight of the mixture of the spherical graphite, carbon black and binding resin, the mixture containing the spherical graphite having an average particle diameter of not less than 1 μm and not more than 30 μm of not less than 50 parts by weight and not more than 70 parts by weight, the carbon black of not less than 1 part by weight and not more than 15 parts by weight and the binder resin including thermosetting resin and elastomer of not less than 15 parts by weight and not more than 40 parts by weight, and heating the mixture to a temperature higher than the temperature at which the thermosetting resin is cured.

The conductive composition fabricated by the method of manufacturing contains the spherical graphite of not less than 50 parts by weight and not more than 70 parts by weight and the carbon black of not less than 1 part by weight and not more than 15 parts by weight. Further, the average particle diameter of the spherical graphite is not less than 1 μm and not more than 30 μm. Therefore, the conductive composition having a smaller thickness can be obtained. Further, the electrical conductivity of the conductive composition is improved.

Further, the conductive composition contains the binder resin of not less than 15 parts by weight and not more than 40 parts by weight, and the spherical graphite and the carbon black are bound by the binder resin. The binder resin includes the thermosetting resin and the elastomer. Therefore, the conductive composition can be easily formed into a desired shape while the thermosetting resin is not cured. Thereafter, the mixture is heated to the temperature higher than the temperature at which the thermosetting resin is cured, so that the conductive composition can be cured in the desired shape. Therefore, the handleability of the conductive composition is improved.

As a result, the conductive composition having a smaller thickness can be obtained and the electrical conductivity and the handleability of the conductive composition is improved.

(12) The method of manufacturing the conductive composition may further include the step of forming the mixture into a sheet shape while heating the mixture to a temperature lower than the temperature at which the thermosetting resin is cured before heating the mixture to the temperature higher than the temperature at which the thermosetting resin is cured.

In this case, the conductive composition can be easily formed into a sheet shape while the thermosetting resin is not cured. Further, the conductive composition is flexible because of the elastomer. Thus, the handleability of the conductive composition formed into a sheet shape is improved.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
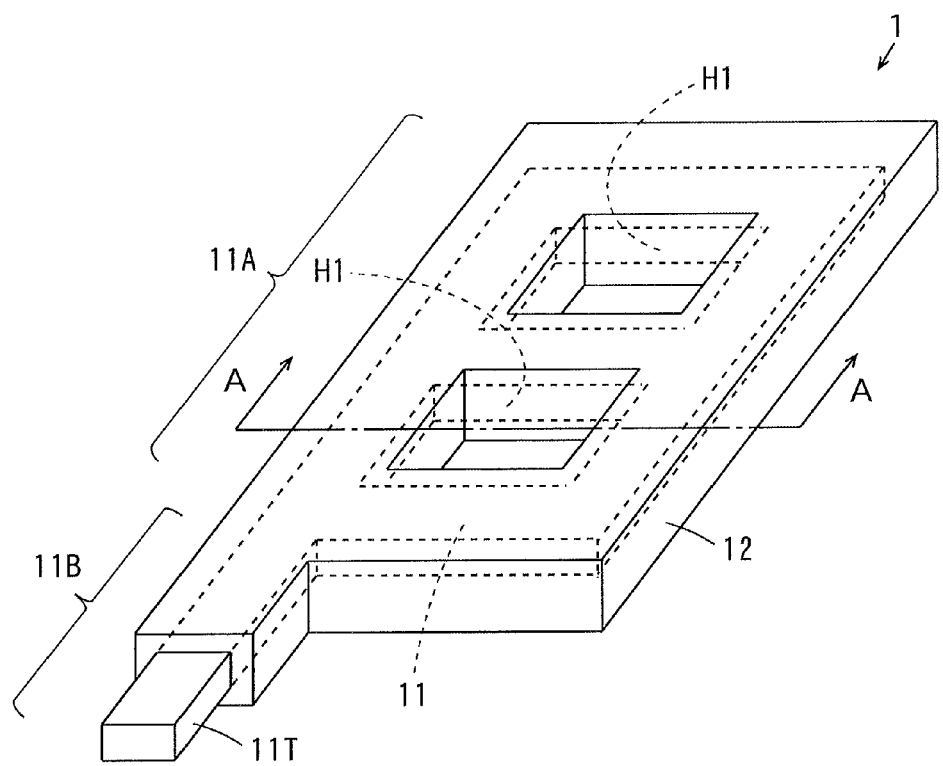
FIG. 1(a) is an external perspective view of a collector sheet according to one embodiment of the present invention.
FIG. 1(b) is a vertical sectional view of the collector sheet of FIG. 1(a) taken along the line A-A.
Figure 1:
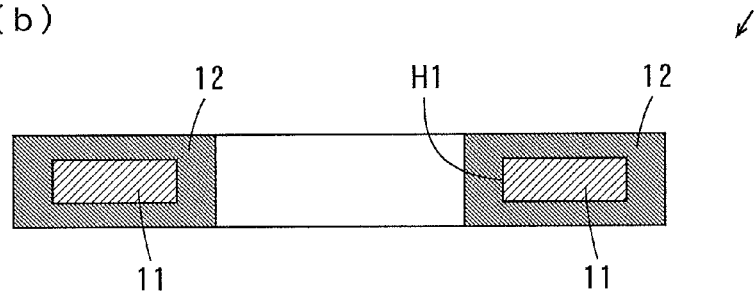

A conductive composition, a conductive composition sheet, a conductive substrate, a collector sheet, a printed circuit board, a fuel cell and a manufacturing method of the conductive composition according to one embodiment of the present invention will be described below with reference to the drawings.

(1) Configuration of Collector Sheet

FIG. 1(a) is an external perspective view of the collector sheet according to one embodiment of the present invention, and FIG. 1(b) is a vertical cross sectional view taken along the line A-A of the collector sheet of FIG. 1(a).

As shown in FIGS. 1(a) and 1(b), the collector sheet 1 includes a conductor layer 11 and a cover layer 12. The conductor layer 11 is composed of a rectangular collector portion 11A and a drawn-out conductor portion 11B. Two openings H1 are formed with a predetermined distance therebetween at the center of the collector portion 11A. The drawn-out conductor portion 11B is formed so as to extend in a long-sized shape from the collector portion 11A.

The cover layer 12 is formed of the conductive composition and is formed on a surface of the conductor layer 11 so as to cover the collector portion 11A and a portion of the drawn-out conductor portion 11B excluding the tip end. In the following description, the exposed tip end of the drawn-out conductor portion 11B that is not covered by the cover layer 12 is referred to as a drawn-out electrode 11T.

(2) Conductive Composition

The conductive composition includes a mixture of spherical graphite, carbon black and binder resin. Further, the binder resin includes thermosetting resin and elastomer.

(a) Spherical Graphite

When the content of the spherical graphite is less than 50 parts by weight to 100 parts by weight of the mixture, the resistance of the conductive composition (the resistance in the thickness direction of the conductive composition sheet described below, for example) becomes larger, so that the sufficient electrical conductivity cannot be obtained. Similarly, when the content of the spherical graphite is larger than 70 parts by weight, the sufficient electrical conductivity cannot be obtained. Therefore, the mixture contains the spherical graphite of not less than 50 parts by weight and not more than 70 parts by weight in the present embodiment.

When an average particle diameter of the spherical graphite is smaller than 1 μm, the resistance among particles of the spherical graphite in the conductive composition becomes larger. When the average particle diameter of the spherical graphite is larger than 30 μm, the surface shape of the conductive composition becomes rough and the contact resistance of the conductive composition becomes larger. Further, it becomes difficult to obtain the conductive composition having a smaller thickness. Therefore, the average particle diameter of the spherical graphite in the mixture is not less than 1 μm and not more than 30 μm in the present embodiment.

(b) Carbon Black

Furnace black, Acetylene black, Ketjen Black (trademark) or the like can be used as the carbon black.

When the content of the carbon black is smaller than 1 part by weight to 100 parts by weight of the mixture, the resistance of the conductive composition becomes larger, so that the sufficient electrical conductivity cannot be obtained. Similarly, when the content of the carbon black is larger than 15 parts by weight, the sufficient electrical conductivity cannot be obtained. Therefore, the mixture contains the carbon black of not less than 1 part by weight and not more than 15 parts by weight in the present embodiment.

When an average particle diameter of the carbon black is smaller than 10 nm, the sufficient electrical conductivity in the conductive composition cannot be obtained. Further, it becomes difficult to form the conductive composition into a sheet shape. Similarly, if the average particle diameter of the carbon black is larger than 1000 nm, it becomes difficult to form the conductive composition into a sheet shape. Therefore, the average particle diameter of the carbon block included in the mixture is preferably not less than 10 nm and not more than 1000 nm and more preferably not less than 30 nm and not more than 800 nm in the present embodiment.

(c) Binder Resin

When the content of the binder resin is smaller than 15 parts by weight to 100 parts by weight of the mixture, it becomes difficult to form the conductive composition into a sheet shape. On the other hand, if the content of the binder resin is larger than 40 parts by weight, the sufficient electrical conductivity cannot be obtained. Therefore, the mixture contains the binder resin of not less than 15 parts by weight and not more than 40 parts by weight in the present embodiment.

(c-1) Thermosetting Resin

Epoxy resin, phenol resin, a resin mixture of the epoxy resin and the phenol resin or the like can be used as the thermosetting resin included in the resin.

(c-2) Elastomer

Acrylonitrile-butadiene rubber, hydrogenated nitrile rubber, styrene-butadiene rubber, ethylene propylene rubber, butadiene rubber, styrene isobutadiene rubber, acrylic rubber, polyurethane rubber, silicone rubber or the like can be used as the elastomer included in the resin.

(c-3) Preferable Contents of Thermosetting Resin and Elastomer

In general, the thermosetting resin after being cured has higher heat resistance than the heat resistance of the elastomer. The content of the thermosetting resin in the binder resin is not less than 5 parts by weight and the content of the elastomer in the binder resin is not more than 90 parts by weight, to 100 parts by weight of the binder resin, so that the sufficient amount of the thermosetting resin can be cured. Therefore, even if a temperature of the environment is higher than the heat resistant temperature of the elastomer, the cured thermosetting resin keeps the shape of the conductive composition before being cured.

Further, the content of the thermosetting resin in the binder resin is not more than 95 parts by weight and the content of the elastomer in the binder resin is not less than 1 part by weight, so that the spherical graphite and the carbon black are reliably bound by the flexible elastomer before the thermosetting resin is cured. Thus, the conductive composition can be more easily formed into a desired shape while the thermosetting resin is not cured.

The content of the thermosetting resin in the binder resin is preferably set to not less than 10 parts by weight and not more than 90 parts by weight, and the content of the elastomer in the binder resin is preferably set to not less than 5 parts by weight and not more than 70 parts by weight, to 100 parts by weight of the binder resin.

Further, the content of the thermosetting resin in the binder resin is more preferably set to not less than 50 parts by weight and not more than 90 parts by weight, and the content of the elastomer in the binder resin is more preferably set to not less than 10 parts by weight and not more than 50 parts by weight, to 100 parts by weight of the binder resin.

(d) Another Additive

The conductive composition may include another additive other than the spherical graphite, the carbon black and the binder resin, described above.

The conductive composition may include scaly graphite, thin graphite, carbon nanotubes, copper powder, nickel powder, tin-bismuth powder, silver powder, copper powder that is plated with tin or conductive filler such as copper powder that is plated with silver, for example. Further, the conductive composition may include a catalyst and the like as another additive for promoting the curing of the binder resin.

(e) Method of Manufacturing Conductive Composition

In fabricating the conductive composition, the mixture of the spherical graphite, the carbon black and the binder resin is first obtained by kneading the spherical graphite, the carbon black and the binder resin, described above, with a kneader. In this case, another additive may be added to the mixture. A roll kneader, a kneading extruder, an intensive mixer, a henschel mixer, a planetary mixer or the like can be used as the kneader.

The temperature of the mixture is kept at the room temperature (25° C., for example) in kneading the spherical graphite, the carbon black and the binder resin. Note that, if necessary, the mixture may be heated to the temperature at which the thermosetting resin is not cured. In this case, each material can be evenly dispersed in the mixture.

Thereafter, the obtained mixture is formed into a sheet shape while being heated to the temperature at which the thermosetting resin is not cured. In this case, an extruder, a roller, a calender, a pressing machine or the like can be used as a processing machine. In the following description, the mixture formed into a sheet shape is referred to as a conductive composition sheet.

(3) Method of Manufacturing Collector Sheet

The method of manufacturing the collector sheet 1 of FIG. 1 will be described. FIG. 2 is a vertical cross sectional view showing the method of manufacturing the collector sheet 1 of FIG. 1. FIGS. 2(a) to 2(d) are vertical cross sectional views of an intermediate in each manufacturing step of the collector sheet 1 and correspond to the vertical cross sectional view taken along the line A-A of FIG. 1(a).

First, as shown in FIG. 2(a), metal foil 11a made of copper and a conductive composition sheet 12a that is not cured are prepared. The temperature of the metal foil 11a and the conductive composition sheet 12a is kept at which the thermosetting resin is not cured (120° C., for example). In this state, the metal foil 11a and the conductive composition sheet 12a are overlaid on each other. Thereafter, constant pressure is applied to the laminate made of the metal foil 11a and the conductive composition sheet 12a using a laminating machine, a pressing machine or the like. Thus, the conductive composition sheet 12a can be easily bonded on the metal foil 11a by thermocompression. Thus, a conductive substrate 2 is formed.

In this case, because the conductive composition sheet 12a is not cured, the metal foil 11a and the conductive composition sheet 12a adhere to each other. Therefore, the contact resistance between the metal foil 11a and the conductive composition sheet 12a can be reduced.

As material for the metal foil 11a, another metal such as stainless steel, aluminum, silver, gold, nickel or the like may be used instead of copper, or an alloy including a plurality of types of these metal may be used. The thickness of the metal foil 11a is preferably not less than 1 µm and not more than 150 µm, and more preferably not less than 3 µm and not more than 100 µm. The thickness of the conductive composition sheet 12a is preferably not less than 5 µm and not more than 500 µm and more preferably not less than 10 µm and not more than 150 µm.

Next, a partial region of the upper surface of the metal foil 11a is etched using ferric chloride such that a conductor layer 11 having a predetermined pattern is formed as shown in FIG. 2(b). Thus, the collector portion 11A and the drawn-out conductor portion 11B (FIG. 1) are formed on the upper surface of the conductive composition sheet 12a.

Then, another conductive composition sheet 12b is prepared. The thickness of the conductive composition sheet 12b is equal to the thickness of the conductive composition sheet 12a. The temperature of the conductor layer 11 and the conductive composition sheets 12a, 12b is kept at which the thermosetting resin is not cured (120° C., for example). In this state, as shown in FIG. 2(c), the conductive composition sheet 12b is overlaid on the upper surface of the conductive composition sheet 12a so as to cover the conductor layer 11. Thereafter, the constant pressure is applied to the laminate made of the conductor layer 11 and the conductive composition sheets 12a, 12b using the laminating machine, the pressing machine or the like. Thus, the conductive composition sheet 12b can be easily bonded on the conductor layer 11 and the conductive composition sheet 12a by thermocompression.

In this case, because the conductive composition sheet 12b is not cured, the conductor layer 11 and the conductive composition sheet 12b adhere to each other. Therefore, the contact resistance between the conductor layer 11 and the conductive composition sheet 12b can be reduced. Further, at the time of thermocompression bonding of the conductive composition sheet 12b, the conductive composition sheet 12b changes its shape in accordance with the shape of the conductor layer 11. Thus, the conductive composition sheet 12b also adheres to the side surface of the conductor layer 11 in this example. As a result, the entire surface of the conductor layer 11 is covered with the conductive composition sheets 12a, 12b.

Next, as shown in FIG. 2(d), part of the conductive composition sheets 12a, 12b is removed by etching. In the conductive composition sheets 12a, 12b of FIG. 2(d), a portion in the opening H1 of the conductor layer 11 is removed by etching. Thus, an opening H2 that is smaller than the opening H1 is formed in the conductive composition sheets 12a, 12b. Further, portions of the conductive composition sheets 12a, 12b, which cover the drawn-out electrode 11T of FIG. 1, is removed by etching.

In such a way, a cover layer 12 that covers part of the conductor layer 11 is formed by the etched conductive composition sheets 12a, 12b. Thus, the collector sheet 1 is fabricated. The fabricated collector sheet 1 is heated to the temperature at which the thermosetting resin is cured such that the cover layer 12 is cured. Thus, the collector sheet 1 of FIG. 1 is completed.

While the conductive substrate 2 is fabricated by laminating the metal foil 11a and the conductive composition sheet 12a in the example of FIG. 2(a), the invention is not limited to this. The conductive substrate 2 may be fabricated by forming a metal layer on the conductive composition sheet 12a. In this case, the metal layer is formed by a method of electrolytic plating, electroless plating, sputtering, vapor deposition or the like, for example. Alternatively, the conductive substrate 2 may be fabricated by coating the metal foil 11a with the kneaded conductive composition that is not cured and forming a layer made of the conductive composition on the metal foil 11a.

While the conductor layer 11 having a predetermined pattern is formed by a subtractive method in the example of FIG. 2, the invention is not limited to this. The conductor layer 11 may be formed by another method such as a semi-additive method.

An insulating layer may be used instead of the conductive composition sheet 12a. As material for the insulating layer, polyimide, polyamide-imide, polyethylene terephthalate, polyethylene naphthalate, polyphenylene sulfide, liquid crystal polymer, polyolefin or the like can be used.

In this case, the insulating layer is first prepared in fabricating the collector sheet 1. A seed layer is formed on the upper surface of the prepared insulating layer and the electrolytic plating is performed. In this way, the conductor layer 11 having a predetermined pattern is formed on the insulating layer. Thereafter, the conductive composition sheet 12b described above is attached on the upper surface of the insulating layer so as to cover the conductor layer 11. Alternatively, the upper surface of the insulating layer is coated with the kneaded conductive composition that is not cured by a printing method.

Next, unnecessary portions of the insulating layer and the conductive composition sheet 12b are removed by etching and the like such that the collector sheet 1 is fabricated. Thereafter, the conductive composition sheet 12b is cured. Thus, the collector sheet 1 having the insulating layer is completed. In the collector sheet 1, the cover layer 12 is formed by the insulating layer and the conductive composition sheet 12b.

Figure 2:
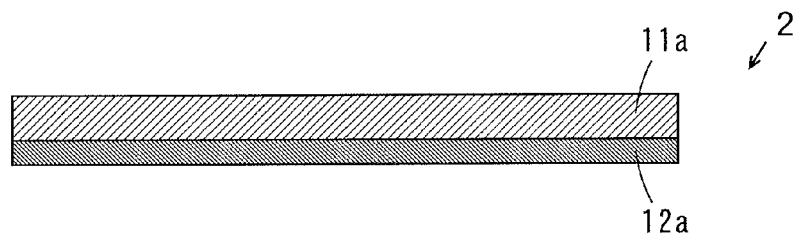
FIGS. 2(a) to 2(d) are vertical cross sectional views showing a method of manufacturing the collector sheet of FIG. 1.
Figure 2:
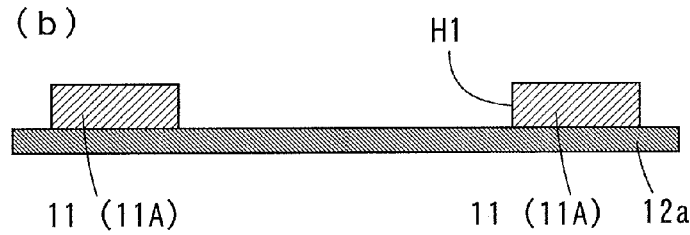
Figure 2:
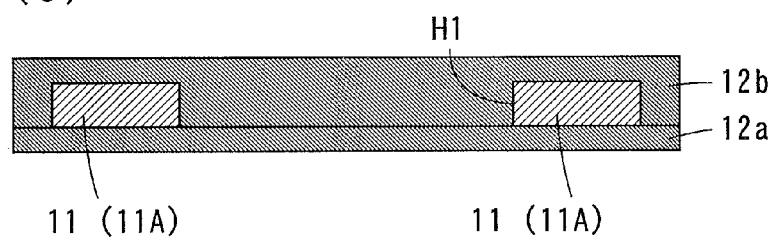
Figure 2:
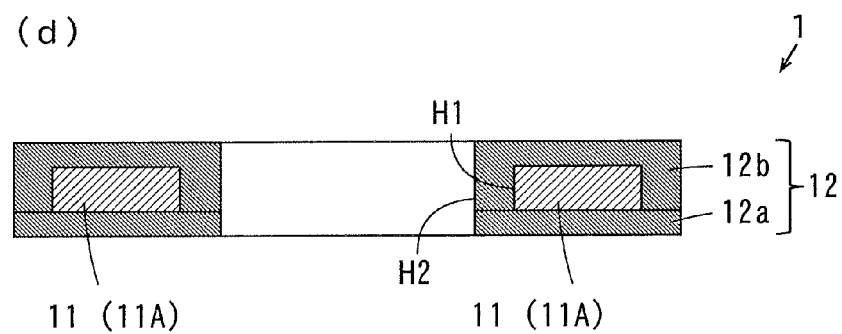

(4) Fuel Cell using the Collector Sheet of FIG. 1

Figure 3:
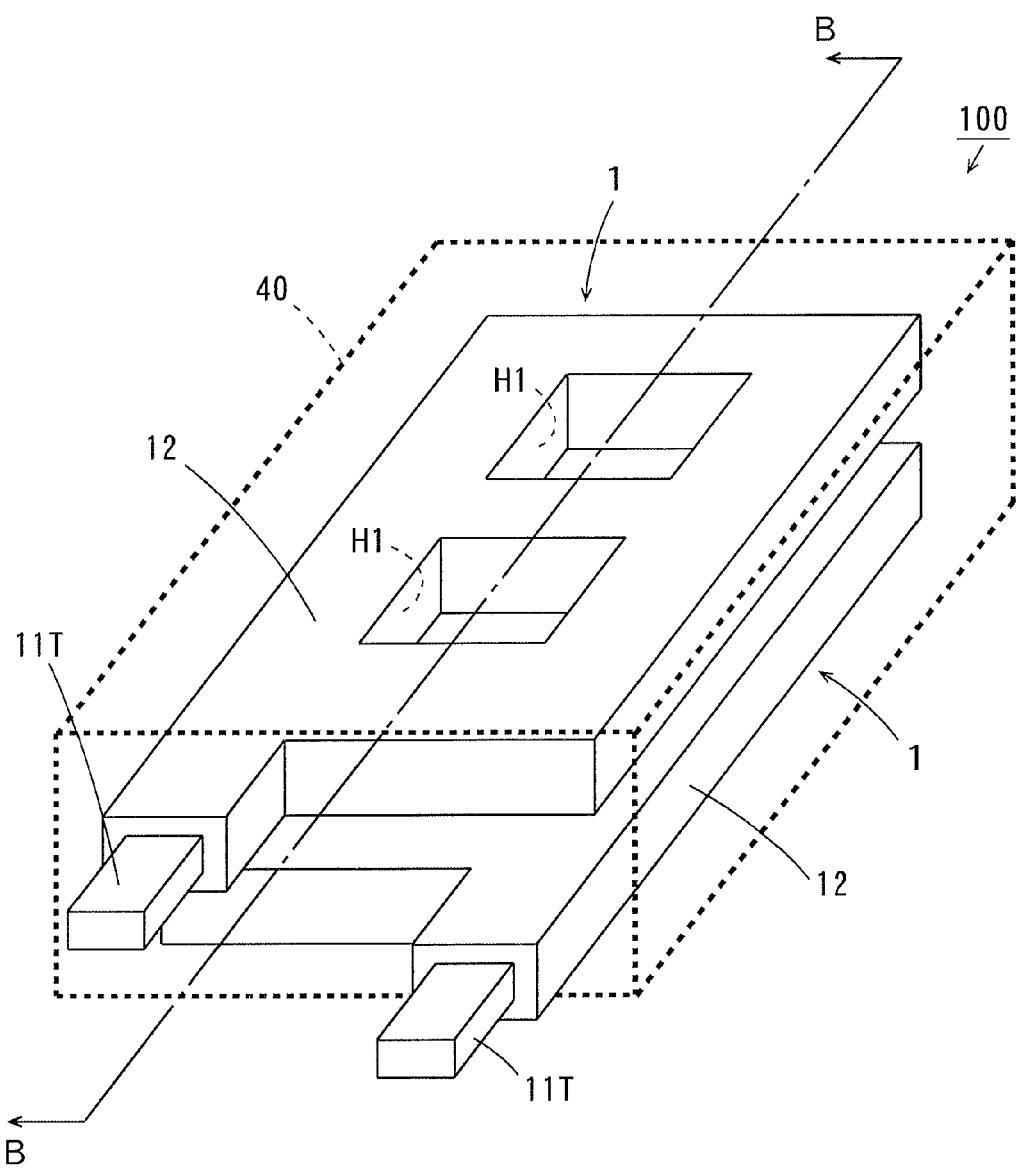
FIG. 3 is a perspective view of a fuel cell using the collector sheet of FIG. 1.
Figure 4:
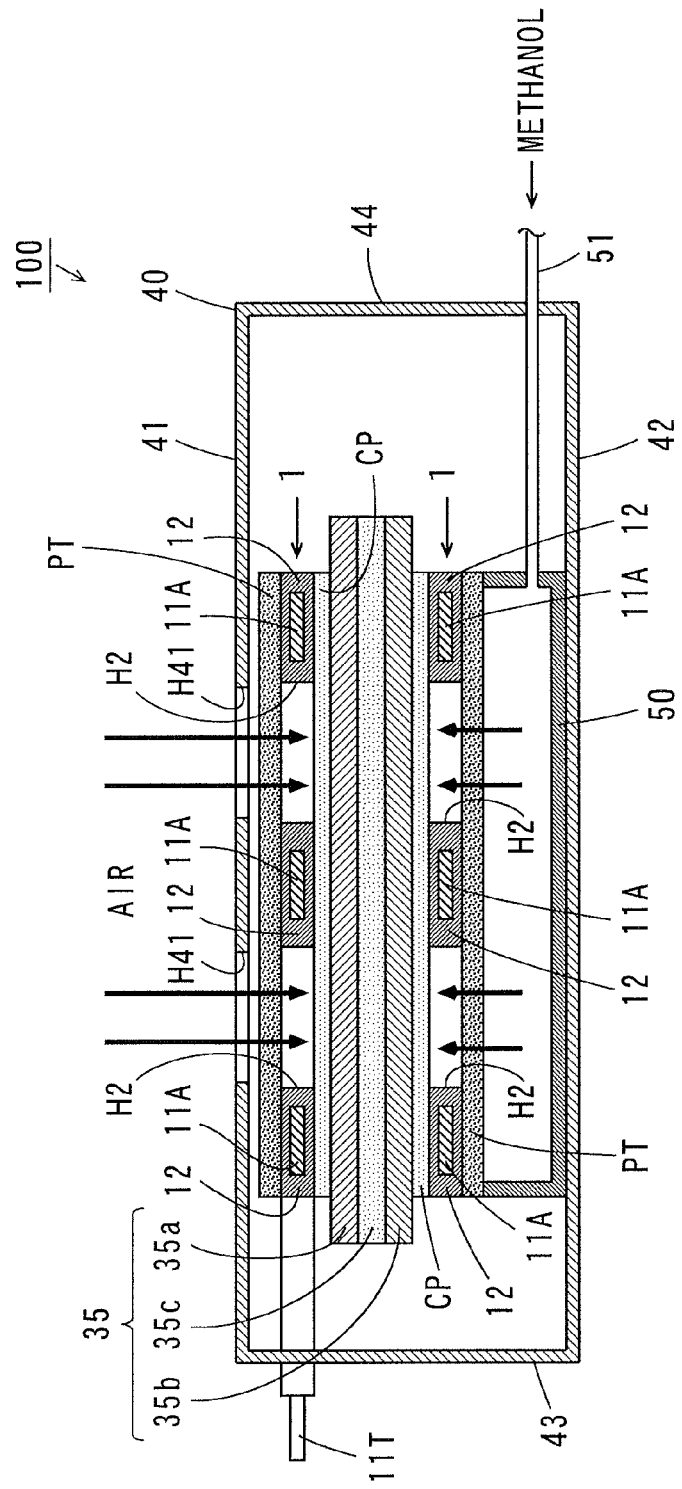
FIG. 4 is a diagram for explaining the function in the fuel cell of FIG. 3.

The fuel cell using the collector sheet 1 of FIG. 1 will be described. FIG. 3 is a perspective view of the fuel cell using the collector sheet 1 of FIG. 1. FIG. 4 is a diagram for explaining the function in the fuel cell of FIG. 3 and shows a vertical cross sectional view taken along the line B-B of the fuel cell of FIG. 3.

As shown in FIG. 3, the fuel cell 100 has a casing 40 having a rectangular parallelepiped shape. In FIG. 3, the casing 40 is indicated by the thick broken line. The two collector sheets 1 are provided in the casing 40. The configuration of each collector sheet 1 is the same as the configuration of the collector sheet of FIG. 1. FIG. 3 does not show the constituent elements provided in the casing 40 other than the collector sheet 1.

As shown in FIG. 4, the casing 40 has an upper surface portion 41, a lower surface portion 42, one side surface portion 43 and the other side surface portion 44. FIG. 4 does not show the remaining pair of side surface portions.

Inside of the casing 40, the two collector sheets 1 are arranged such that the two collector portions 11A of the two collector sheets 1 (see FIG. 1) are opposite to each other with an electrode film 35 sandwiched therebetween. The two drawn-out electrodes 11T of the two collector sheets 1 are drawn out of the one side surface portion 43 of the casing 40, respectively. Terminals of various external circuits are electrically connected to the two drawn-out electrodes 11T.

The electrode film 35 is composed of an air electrode 35a, a fuel electrode 35b and an electrolyte film 35c. The air electrode 35a is formed on the upper surface of the electrolyte film 35c, and the fuel electrode 35b is formed on the lower surface of the electrolyte film 35c.

A carbon paper CP is provided between the one collector sheet 1 and the air electrode 35a. A porous film PT made of tetrafluoroethylene is provided between the one collector sheet 1 and the upper surface portion 41 of the casing 40. A plurality of openings H41 are formed so as to correspond with the openings H2 of the cover layer 12 (FIG. 2) in the one collector sheet 1. Air is supplied from the outer space of the casing 40 to the air electrode 35a of the electrode film 35 through the openings H41, the porous film PT, the openings H2 of the cover layer 12 and the carbon paper CP.

The carbon paper CP is provided between the other collector sheet 1 and the fuel electrode 35b. Inside of the casing 40, a fuel accommodating chamber 50 is provided on the lower surface portion 42. The porous film PT is provided between the other collector sheet 1 and the fuel accommodating chamber 50. One end of a fuel supply pipe 51 is connected to the fuel accommodating chamber 50. The other end of the fuel supply pipe 51 is connected to an external fuel supplier (not shown) through the other side surface portion 44 of the casing 40. Fuel is supplied to the fuel accommodating chamber 50 from the fuel supplier through the fuel supply pipe 51. Note that liquid methanol is used as the fuel in the present embodiment.

The porous film PT provided between the other collector sheet 1 and the fuel accommodating chamber 50 functions as a gas-liquid separation membrane. This causes part of the methanol to be vaporized in the fuel accommodating chamber 50 such that the vaporized methanol is supplied to the fuel electrode 35b of the electrolyte film 35 through the porous film PT, the openings H2 of the cover layer 12 and the carbon paper CP.

In the configuration described above, the methanol is decomposed into hydrogen ion and carbon dioxide in the plurality of fuel electrodes 35b, to produce electrons. The produced electrons are guided from the collector portion 11A of the other collector sheet 1 to the drawn-out electrode 11T. The hydrogen ion obtained by decomposing the methanol permeates through the electrolyte film 35c, to reach the air electrode 35a. In the plurality of air electrodes 35a, the hydrogen ions and oxygen react with each other while the electrons, which have been guided from the drawn-out electrode 11T to the collector portion 11A of the one collector sheet 1, are consumed, to form water. In such a manner, electrical power is supplied to the external circuit connected to the two drawn-out electrodes 11T.

Figure 5:
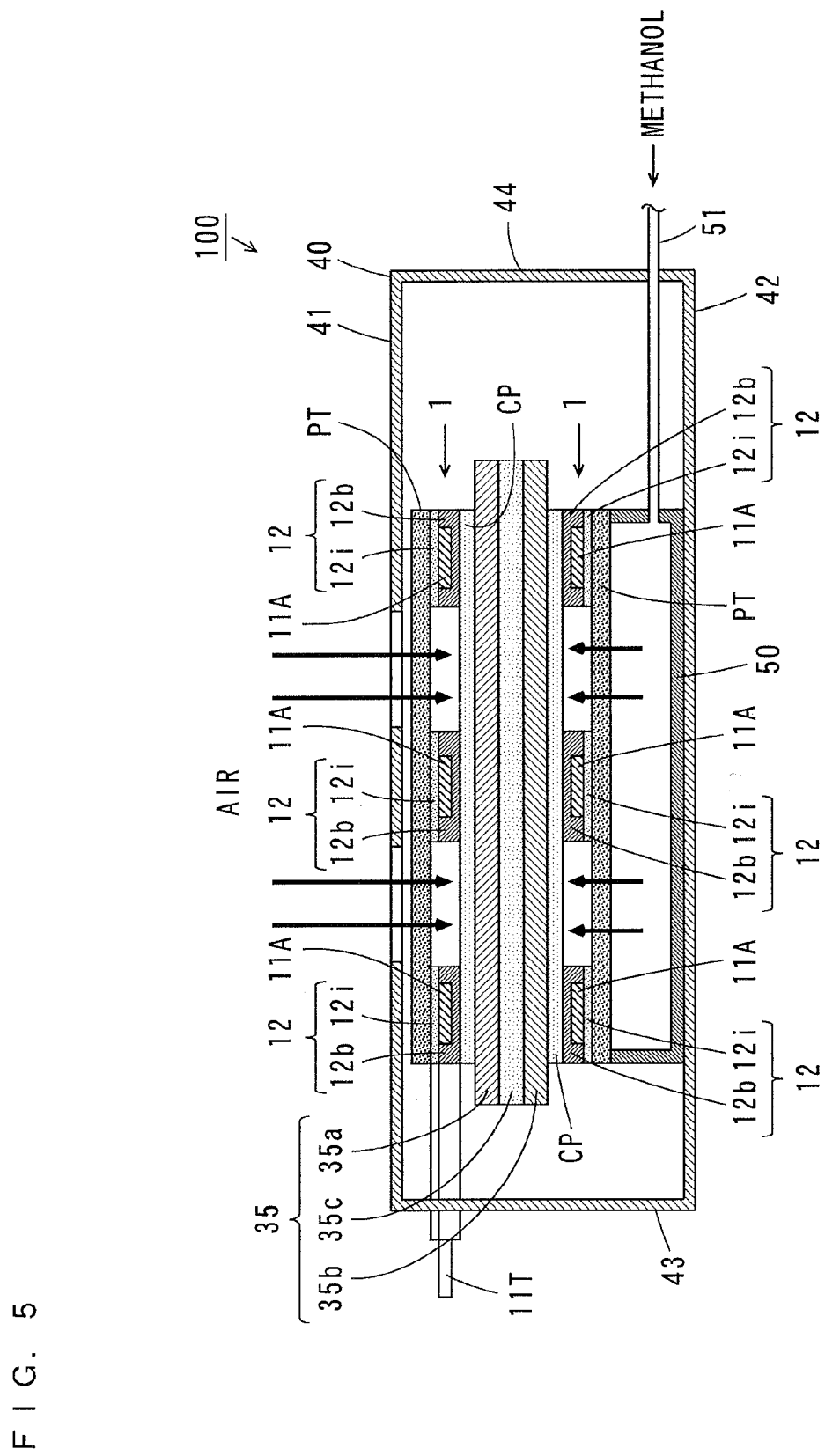
FIG. 5 is a diagram showing another example of the configuration of the fuel cell and FIG. 6 is a schematic view showing a method of evaluating the electrical conductivity in the thickness direction of the samples of inventive examples 1 to 6 and comparative examples 1 to 6.

In the fuel cell 100, a collector sheet 1 including an insulating layer instead of the conductive composition sheet 12a described above can be used. FIG. 5 is a diagram showing an example of another configuration of the fuel cell. In the fuel cell 100 of FIG. 5, the collector sheet 1 including an insulating layer 12i instead of the conductive composition sheet 12a of FIG. 2 is used. The cover layer 12 is formed by the insulating layer 12i and the conductive composition sheet 12b. The insulating layer 12i is made of polyimide, for example. In this case, in the one collector sheet 1, the insulating layer 12i is arranged on the opposite side of the air electrode 35a with the conductor layer 11 as a center. Further, in the other collector sheet 1, the insulating layer 12i is arranged on the opposite side of the fuel electrode 35b with the conductor layer 11 as a center. Similarly to the example of FIG. 4, the fuel is also supplied into the fuel accommodating chamber 50 in the fuel cell 100 of FIG. 5, and therefore, electrical power is supplied to the external circuit that is connected to the two drawn-out electrodes 11T.

While the conductive composition is used for the collector sheet 1 of the fuel cell 100 in the examples of FIGS. 4 and 5, the invention is not limited to this. The conductive composition may be used for another member in the fuel cell 100.

(5) Effects (5-1)

The conductive composition according to the present embodiment includes the mixture of the spherical graphite, the carbon black and the binder resin. The mixture contains the spherical graphite of not less than 50 parts by weight and not more than 70 parts by weight and the carbon black of not less than 1 part by weight and not more than 15 parts by weight. Further, an average particle diameter of the spherical graphite is not less than 1 μm and not more than 30 μm.

In this case, the carbon black is filled in high density among particles of the spherical graphite. Thus, the density of the conductive composition is high and the surface of the conductive composition is smooth. Therefore, the conductive composition having a smaller thickness can be obtained. Further, the resistance among particles of the spherical graphite is reduced because of the carbon black, so that the electrical conductivity of the conductive composition is improved.

Further, the mixture contains the binder resin of not less than 15 parts by weight and not more than 40 parts by weight. Thus, the spherical graphite and the carbon black are bound by the binder resin. The binder resin includes the thermosetting resin and the elastomer. Therefore, the spherical graphite and the carbon black are bound by the flexible elastomer before the thermosetting resin is cured. Thus, the conductive composition can be easily formed into a desired shape while the thermosetting resin is not cured. Thereafter, the thermosetting resin is cured, so that the shape of the conductive composition before being cured is maintained. Therefore, the handleability of the conductive composition is improved.

As a result, the conductive composition having a smaller thickness can be obtained and the electrical conductivity and the handleability of the conductive composition are improved.

(5-2)

When the thermosetting resin includes at least one of the epoxy resin and the phenol resin, the chemical resistance of the conductive composition is improved. Further, the flexibility of the conductive composition can be maintained even after the epoxy resin and the phenol resin are cured.

(5-3)

The conductive composition sheets 12a, 12b according to the present embodiment are made of the conductive composition described above of which the thickness can be reduced. Therefore, the conductive composition sheets 12a, 12b having smaller thicknesses can be obtained.

In the conductive composition sheets 12a, 12b, the electrical conductivity of the conductive composition is improved because of the spherical graphite and the carbon black. The conductive composition contains a larger amount of the spherical graphite than the carbon black. The resistivity anisotropy is small in each particle of the spherical graphite. Thus, even when each particle of the carbon black has the resistivity anisotropy, the resistivity anisotropy of the conductive composition sheets 12a, 12b is reduced because of the larger amount of the spherical graphite than the carbon black. As a result, in the conductive composition sheets 12a, 12b, the sufficient electrical conductivity is ensured in the thickness direction.

Before the thermosetting resin is cured, the conductive composition sheets 12a, 12b are flexible and adhesive because of the elastomer. Thus, the conductive composition sheets 12a, 12b can be easily attached to a desired member while the thermosetting resin is not cured. Thereafter, the thermosetting resin is cured, so that the conductive composition sheets 12a, 12b can be easily fixed to the member. Therefore, the handleability of the conductive composition sheets 12a, 12b is improved.

(5-4)

Before the thermosetting resin is cured, the conductive composition sheet 12a is flexible and adhesive because of the elastomer. Thus, according to the conductive substrate 2 described above, the metal foil 11a can be easily attached to a desired member with the conductive composition sheet 12a sandwiched therebetween while the thermosetting resin is not cured. Thereafter, the thermosetting resin is cured, so that the metal foil 11a and the conductive composition sheet 12a can be easily fixed to the member.

Further, one surface of the metal foil 11a is covered with the conductive composition sheet 12a. Thus, the one surface of the metal foil 11a is prevented from corroding.

(5-5)

The collector sheet 1 according to the present embodiment includes the conductive composition sheets 12a, 12b described above of which the thickness can be reduced. Therefore, the collector sheet 1 having a smaller thickness can be obtained. Further, in the collector sheet 1, the cover layer 12 formed of the conductive composition sheets 12a, 12b is provided to cover the collector portion 11A and part of the drawn-out conductor portion 11B excluding the drawn-out electrode 11T. Because the conductive composition sheets 12a, 12b have the excellent electrical conductivity, a loss of the electrical power in the cover layer 12 is reduced even if the power collection by the collector portion 11A is preformed through the cover layer 12. Furthermore, the conductive composition sheets 12a, 12b have the excellent handleability. Thus, the collector sheet 1 can be easily fabricated.

(5-6)

The fuel cell 100 according to the present embodiment includes the collector sheet 1 described above. In the collector sheet 1, a loss of electrical energy in the cover layer 12 is reduced during the power collection. As a result, the fuel cell 100 with high efficiency can be obtained. Further, the above-mentioned collector sheet 1 having a smaller thickness can be obtained. Therefore, the fuel cell 100 having a smaller thickness can be realized. Furthermore, the collector sheet 1 has the excellent handleability. Thus, the fuel cell 100 can be easily fabricated using the collector sheet 1.

(6) Correspondence Between Elements in the Claims and Parts in Embodiments

In the following paragraph, non-limiting examples of correspondences between various elements recited in the claims below and those described above with respect to various preferred embodiments of the present invention are explained.

In the embodiment described above, the conductive composition is an example of a conductive composition, the conductor layer 11 and the metal foil 11a are examples of a metal layer and the conductor layer 11, and the metal foil 11a are examples of a conductor layer. Further, the conductive composition sheets 12a, 12b are examples of a conductive composition sheet, the insulating layer 12i is an example of an insulating layer, the cover layer 12 is an example of a cover layer and the casing 40 is an example of a casing. Further, the electrode film 35 is an example of a cell element, the openings H1, H2 are examples of an opening, the collector sheet 1 of FIGS. 1, 3 and 4 is an example of a collector sheet and the collector sheet 1 including the insulating layer 12i of FIG. 5 is an example of a printed circuit board.

While preferred embodiments of the present invention have been described above, it is to be understood that variations and modifications will be apparent to those skilled in the art without departing the scope and spirit of the present invention. The scope of the present invention, therefore, is to be determined solely by the following claims.

(7) Inventive Examples and Comparative Examples

Samples serving as the inventive examples 1 to 6 and the comparative examples 1 to 6 were prepared in the following manner.

(7-1) Inventive Example 1

63 parts by weight of spherical graphite (CGC20 manufactured by Nippon Graphite Industries, ltd.), 5.5 parts by weight of carbon black (#3030B manufactured by Mitsubishi Chemical Corporation), 10 parts by weight of epoxy resin (YSLV-80XY manufactured by Nippon Steel & Sumikin Chemical Co., Ltd.), 11 parts by weight of phenol resin (MEH7851SS manufactured by Meiwa Plastic Industries, Ltd.), 10 parts by weight of aclylic elastomer (LA2140e manufactured by Kuraray Co., Ltd.) and 0.5 part by weight of a catalyst (2PHZ-PW manufactured by Shikoku Chemicals Corporation) were dry blended and were kneaded for 30 minutes at 120° C. while the rotation speed was kept at 30 rpm by a labo plastomill. The obtained mixture was divided into small pieces of 20 mm squares. The pressure of 3 kgf/cm² was applied to one of the divided mixtures by a pressing machine for five minutes while the temperature of the divided mixture was kept at 120° C., whereby the mixture was formed into a sheet shape and a conductive composition sheet was obtained. An average particle diameter of the spherical graphite (CGC20 manufactured by Nippon Graphite Industries, ltd.) was 20 μm and an average particle diameter of the carbon black (#3030B manufactured by Mitsubishi Chemical Corporation) was 0.8 μm.

Next, copper foil was prepared and the conductive composition sheet that was not cured was bonded on the copper foil by the pressing machine. Thus, the laminate of the copper foil and the conductive composition sheet (a conductive substrate) was obtained. Thereafter, the obtained laminate was thermally processed for four hours while a temperature of the laminate was kept at 175° C. by a hot-air drying machine whereby the conductive composition sheet was cured. Thus, a conductive substrate made of the copper foil and the conductive composition sheet was obtained as the sample of the inventive example 1. In this conductive substrate, the thickness of the copper foil is 18 μm and the thickness of the conductive composition sheet is 250 μm.

In the conductive composition used in the inventive example 1, the respective content of the spherical graphite, the carbon black, the epoxy resin, the phenol resin and the elastomer is set to a substantially intermediate value in the range of the respective content shown in the embodiment described above.

(7-2) Inventive Example 2

Except that the respective content of the spherical graphite, the carbon black, the epoxy resin, the phenol resin, the elastomer and the catalyst in the mixture was 54 parts by weight, 9 parts by weight, 12 parts by weight, 13 parts by weight, 11.5 parts by weight and 0.5 part by weight, the sample of the inventive example 2 was fabricated similarly to the inventive example 1.

In the conductive composition used for the inventive example 2, the content of the spherical graphite is close to the lower limit of the content of the spherical graphite shown in the embodiment described above (not less than 50 parts by weight and not more than 70 parts by weight). Further, the content of the carbon black is close to the upper limit of the content of the carbon black (not less than 1 part by weight and not more than 15 parts by weight) shown in the embodiment described above.

(7-3) Inventive Example 3

Except that the respective content of the spherical graphite, the carbon black, the epoxy resin, the phenol resin, the elastomer and the catalyst in the mixture was 67 parts by weight, 6 parts by weight, 8.5 parts by weight, 10 parts by weight, 8 parts by weight and 0.5 part by weight, the sample of the inventive example 3 was fabricated similarly to the inventive example 1.

In the conductive composition used for the inventive example 3, the content of the spherical graphite is close to the upper limit of the content of the spherical graphite (not less than 50 parts by weight and not more than 70 parts by weight) shown in the embodiment described above.

(7-4) Inventive Example 4

Except that ED 300 manufactured by Lion Corporation was used as the carbon black and the respective content of the spherical graphite, the carbon black, the epoxy resin, the phenol resin, the elastomer and the catalyst in the mixture was 66 parts by weight, 1.9 parts by weight, 10 parts by weight, 11.6 parts by weight, 10 parts by weight and 0.5 part by weight, the sample of the inventive example 4 was fabricated similarly to the inventive example 1.

In the conductive composition used for the inventive example 4, the content of the carbon black is close to the lower limit of the content of the carbon black (not less than 1 part by weight and not more than 15 parts by weight) shown in the embodiment described above. Further, an average particle diameter of the carbon black used for the inventive example 4 is different from the average particle diameter of the carbon black used for the inventive example 1. The average particle diameter of the carbon black (ED300 manufactured by Lion Corporation) used for the inventive example 4 is 0.7 μm.

(7-5) Inventive Example 5

Except that #5500 manufactured by Tokai Carbon Co., Ltd. was used as the carbon black, the sample of the inventive example 5 was fabricated similarly to the inventive example 1. An average particle diameter of the carbon black used for the inventive example 5 is different from the average particle diameter of the carbon black used for the inventive example 1. The average particle diameter of the carbon black (#5500 manufactured by Tokai Carbon Co., Ltd.) used for the inventive example 5 is 0.2 μm.

(7-6) Inventive Example 6

Except that styrene elastomer (SIBSTAR072T manufactured by Kaneka Corporation) was used as the elastomer, the sample of the inventive example 6 was fabricated similarly to the inventive example 1.

(7-7) Comparative Example 1

Except that the respective content of the spherical graphite, the carbon black, the epoxy resin, the phenol resin, the elastomer and the catalyst in the mixture was 68 parts by weight, 0 part by weight, 10 parts by weight, 11.5 parts by weight, 10 parts by weight and 0.5 part by weight, the sample of the comparative example 1 was fabricated similarly to the inventive example 1. Therefore, the conductive composition used for the comparative example 1 does not include the carbon black.

(7-8) Comparative Example 2

Except that scaly graphite (CPB manufactured by Nippon Graphite Industries, ltd.) was used instead of the spherical graphite and the respective content of the scaly graphite, the carbon black, the epoxy resin, the phenol resin, the elastomer and the catalyst in the mixture was 58 parts by weight, 0 part by weight, 14 parts by weight, 14.5 parts by weight, 13 parts by weight and 0.5 part by weight, the sample of the comparative example 2 was fabricated similarly to the inventive example 1. An average particle diameter of the scaly graphite (CPB manufactured by Nippon Graphite Industries, ltd.) used for the comparative example 2 is 19 μm. Therefore, the conductive composition used for the comparative example 2 includes the scaly graphite instead of the spherical graphite and does not include the carbon black.

(7-9) Comparative Example 3

Except that the scaly graphite (CPB manufactured by Nippon Graphite Industries, ltd.) was used instead of the spherical graphite and the respective content of the scaly graphite, the carbon black, the epoxy resin, the phenol resin, the elastomer and the catalyst in the mixture was 53.5 parts by weight, 6 parts by weight, 13 parts by weight, 15 parts by weight, 12 parts by weight and 0.5 part by weight, the sample of the comparative example 3 was fabricated similarly to the inventive example 1. Therefore, the conductive composition used for the comparative example 3 includes the scaly graphite instead of the spherical graphite.

(7-10) Comparative Example 4

Except that the respective content of the spherical graphite, the carbon black, the epoxy resin, the phenol resin, the elastomer and the catalyst in the mixture was 63 parts by weight, 5.5 parts by weight, 15 parts by weight, 16 parts by weight, 0 part by weight and 0.5 part by weight, the sample of the comparative example 4 was fabricated similarly to the inventive example 1. Therefore, the conductive composition used for the comparative example 4 does not include the elastomer.

(7-11) Comparative Example 5

Except that styrene elastomer (SIBSTAR072T manufactured by Kaneka Corporation) was used as the elastomer and the respective content of the spherical graphite, the carbon black, the epoxy resin, the phenol resin, the elastomer and the catalyst in the mixture was 46 parts by weight, 10 parts by weight, 14.5 parts by weight, 15.5 parts by weight, 13.5 parts by weight and 0.5 part by weight, the sample of the comparative example 5 was fabricated similarly to the inventive example 1.

In the conductive composition used for the comparative example 5, the content of the spherical graphite is less than the lower limit of the content of the spherical graphite shown in the embodiment described above (not less than 50 parts by weight and not more than 70 parts by weight).

(7-12) Comparative Example 6

Except that CGC50 manufactured by Nippon Graphite Industries, ltd. was used as the spherical graphite, ED300 manufactured by Lion Corporation was used as the carbon black and the respective content of the spherical graphite, the carbon black, the epoxy resin, the phenol resin, the elastomer and the catalyst in the mixture was 60 parts by weight, 2 parts by weight, 12.5 parts by weight, 13.5 parts by weight, 11.5 parts by weight and 0.5 part by weight, the sample of the comparative example 6 was fabricated similarly to the inventive example 1.

An average particle diameter of the spherical graphite (CGC 50 manufactured by Nippon Graphite Industries, ltd.) used for the comparative example 6 is 50 μm. In the conductive composition used for the comparative example 6, the average particle diameter of the spherical graphite is larger than the upper limit of the average particle diameter of the spherical graphite described in the embodiment described above (not less than 1 μm and not more than 30 μm).

Each type and content of the material in the conductive composition used for the inventive examples 1 to 3 are shown in Table 1. Each type and content of the material in the conductive composition used for the inventive examples 4 to 6 are shown in Table 2. Further, each type and content of the material in the conductive composition used for the comparative examples 1 to 3 are shown in Table 3. Each type and content of the material in the conductive composition used for the comparative examples 4 to 6 are shown in Table 4. In Tables 1 to 4, the average particle diameters of the graphite (the spherical graphite or the scaly graphite) used for the inventive examples 1 to 6 and the comparative examples 1 to 6 are shown.

TABLE 1

| | | INVENTIVE EXAMPLE 1 | INVENTIVE EXAMPLE 2 | INVENTIVE EXAMPLE 3 |
|---|---|---|---|---|
| GRAPHITE | TYPE | CGC20 | CGC20 | CGB20 |
| | PARTS BY WEIGHT | 63.0 | 54.0 | 67.0 |
| | PARTICLE DIAMETER | 20 μm | 20 μm | 20 μm |
| CARBON BLACK | TYPE | #3030B | #3030B | #3030B |
| | PARTS BY WEIGHT | 5.5 | 9.0 | 6.0 |
| EPOXY RESIN | TYPE | YSLV-80XY | YSLV-80XY | YSLV-80XY |
| | PARTS BY WEIGHT | 10.0 | 12.0 | 8.5 |
| PHENOL RESIN | TYPE | MEH7851SS | MEH7851SS | MEH7851SS |
| | PARTS BY WEIGHT | 11.0 | 13.0 | 10.0 |
| ELASTOMER RESIN | TYPE | LA2140e | LA2140e | LA2140e |
| | PARTS BY WEIGHT | 10.0 | 11.5 | 8.0 |
| CATALYST | TYPE | 2PHZ-PW | 2PHZ-PW | 2PHZ-PW |
| | PARTS BY WEIGHT | 0.5 | 0.5 | 0.5 |

TABLE 2

| | | INVENTIVE EXAMPLE 4 | INVENTIVE EXAMPLE 5 | INVENTIVE EXAMPLE 6 |
|---|---|---|---|---|
| GRAPHITE | TYPE | CGC20 | CGC20 | CGC20 |
| | PARTS BY WEIGHT | 66.0 | 63.0 | 63.0 |
| | PARTICLE DIAMETER | 20 μm | 20 μm | 20 μm |
| CARBON BLACK | TYPE | ED300 | #5500 | #3030B |
| | PARTS BY WEIGHT | 1.9 | 5.5 | 5.5 |
| EPOXY RESIN | TYPE | YSLV-80XY | YSLV-80XY | YSLV-80XY |
| | PARTS BY WEIGHT | 10.0 | 10.0 | 10.0 |
| PHENOL RESIN | TYPE | MEH7851SS | MEH7851SS | MEH7851SS |
| | PARTS BY WEIGHT | 11.6 | 11.0 | 11.0 |

TABLE 2-continued

|  |  | INVENTIVE EXAMPLE 4 | INVENTIVE EXAMPLE 5 | INVENTIVE EXAMPLE 6 |
|---|---|---|---|---|
| ELASTOMER RESIN | TYPE | LA2140e | LA2140e | SIBSTAR072T |
|  | PARTS BY WEIGHT | 10.0 | 10.0 | 10.0 |
| CATALYST | TYPE | 2PHZ-PW | 2PHZ-PW | 2PHZ-PW |
|  | PARTS BY WEIGHT | 0.5 | 0.5 | 0.5 |

TABLE 3

|  |  | COMPARATIVE EXAMPLE 1 | COMPARATIVE EXAMPLE 2 | COMPARATIVE EXAMPLE 3 |
|---|---|---|---|---|
| GRAPHITE | TYPE | CGC20 | CPB | CPB |
|  | PARTS BY WEIGHT | 68.0 | 58.0 | 53.5 |
|  | PARTICLE DIAMETER | 20 μm | 19 μm | 19 μm |
| CARBON BLACK | TYPE | — | — | #3030B |
|  | PARTS BY WEIGHT | — | — | 6.0 |
| EPOXY RESIN | TYPE | YSLV-80XY | YSLV-80XY | YSLV-80XY |
|  | PARTS BY WEIGHT | 10.0 | 14.0 | 13.0 |
| PHENOL RESIN | TYPE | MEH7851SS | MEH7851SS | MEH7851SS |
|  | PARTS BY WEIGHT | 11.5 | 14.5 | 15.0 |
| ELASTOMER RESIN | TYPE | LA2140e | LA2140e | LA2140e |
|  | PARTS BY WEIGHT | 10.0 | 13.0 | 12.0 |
| CATALYST | TYPE | 2PHZ-PW | 2PHZ-PW | 2PHZ-PW |
|  | PARTS BY WEIGHT | 0.5 | 0.5 | 0.5 |

TABLE 4

|  |  | COMPARATIVE EXAMPLE 4 | COMPARATIVE EXAMPLE 5 | COMPARATIVE EXAMPLE 6 |
|---|---|---|---|---|
| GRAPHITE | TYPE | CGC20 | CGC20 | CGC50 |
|  | PARTS BY WEIGHT | 63.0 | 46.0 | 60.0 |
|  | PARTICLE DIAMETER | 20 μm | 20 μm | 50 μm |
| CARBON BLACK | TYPE | #3030B | #3030B | ED300 |
|  | PARTS BY WEIGHT | 5.5 | 10.0 | 2.0 |
| EPOXY RESIN | TYPE | YSLV-80XY | YSLV-80XY | YSLV-80XY |
|  | PARTS BY WEIGHT | 15.0 | 14.5 | 12.5 |
| PHENOL RESIN | TYPE | MEH7851SS | MEH7851SS | MEH7851SS |
|  | PARTS BY WEIGHT | 16.0 | 15.5 | 13.5 |
| ELASTOMER RESIN | TYPE | — | SIBSTAR072T | LA2140e |
|  | PARTS BY WEIGHT | — | 13.5 | 11.5 |
| CATALYST | TYPE | 2PHZ-PW | 2PHZ-PW | 2PHZ-PW |
|  | PARTS BY WEIGHT | 0.5 | 0.5 | 0.5 |

(8) Evaluation (8-1) Sheet Forming Evaluation

In fabricating each sample of the inventive examples 1 to 6 and the comparative examples 1 to 6, the conductive composition sheet before being cured that was obtained by applying the pressure to the divided mixture was observed and it was determined whether or not the sheet shape was maintained in the conductive composition sheet.

As a result, the sheet shapes were maintained in the conductive composition sheets of the inventive examples 1 to 6 and the comparative examples 1 to 3, 5 and 6. On the other hand, the sheet shape was not maintained in the conductive composition sheet of the comparative example 4.

(8-2) Sheet Appearance Evaluation

In fabricating each sample of the inventive examples 1 to 6 and the comparative examples 1 to 6, the surface of the conductive composition sheet before being cured that was obtained by applying the pressure to the divided mixture was observed using an optical microscope and a scanning electron microscope (SEM) and it was determined whether or not there were projections.

As a result, the projections were not observed on the surfaces in the conductive composition sheets of the inventive examples 1 to 6 and the comparative examples 1 to 5. On the other hand, the projections were observed on the surface in the conductive composition sheet of the comparative example 6.

(8-3) Electrical Conductivity Evaluation

Figure 6:
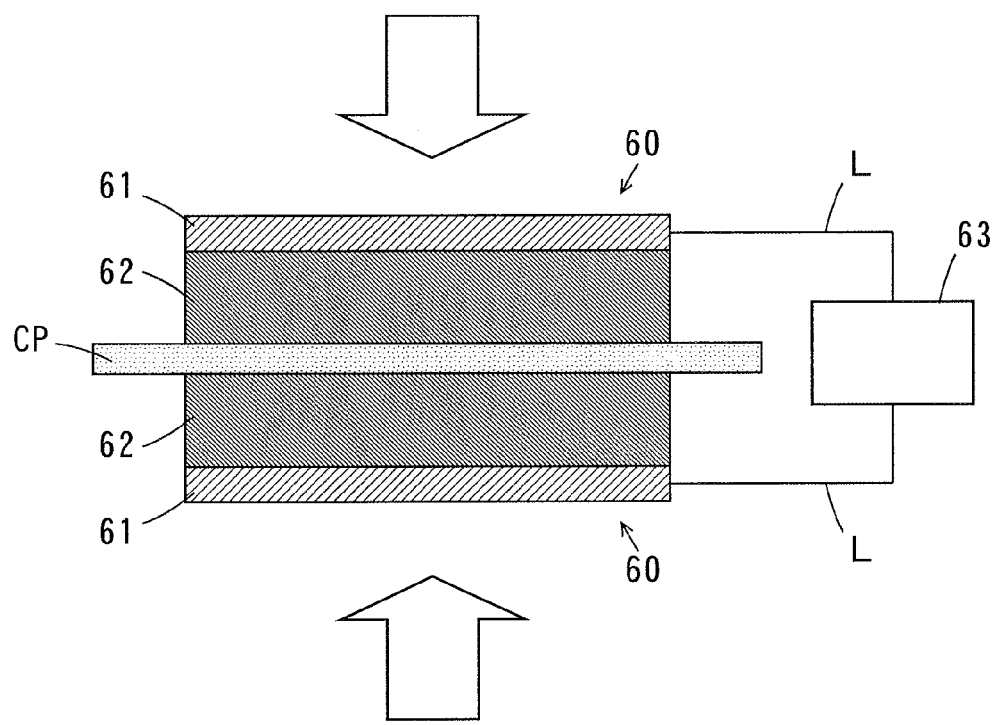

The evaluation of the electrical conductivity in the thickness direction of the samples of the inventive examples 1 to 6 and the comparative examples 1 to 6 was performed. FIG. 6 is a schematic diagram showing an evaluation method of the electrical conductivity in the thickness direction of the samples of the inventive examples 1 to 6 and the comparative examples 1 to 6.

One pair of samples 60 for each of the inventive examples 1 to 6 and the comparative examples 1 to 6 were prepared. As shown in FIG. 6, each pair of samples 60 and a carbon paper CP were arranged such that a conductive composition sheet 62 of the one sample 60 and the conductive composition sheet 62 of the other sample 60 were opposite to each other with the carbon paper CP sandwiched therebetween.

A resistance measurement device 63 was connected to copper foil 61 of each sample 60 through connecting wires L. The one pair of samples 60 were pressed against the one surface and the other surface of the carbon paper CP with the pressure of 3 kgf/cm$^2$. In this state, the resistance value between the copper foil 61 of the one pair of samples 60 was measured by the resistance measurement device 63 as the electrical conductivity in the thickness direction of the sample.

Measurement results of the samples of the inventive examples 1 to 6 were 15 mΩ, 24 mΩ, 33 mΩ, 124 mΩ, 12 mΩ and 9 mΩ. On the other hand, the measurement results of the samples of the comparative examples 1 to 3, 5 and 6 were 230 mΩ, 210 mΩ, 205 mΩ, 240 mΩ and 225 mΩ. The sheet shape was not maintained in the conductive composition sheet of the sample of the comparative example 4, so that the sample of the comparative example 4 could not be fabricated. Therefore, the evaluation of the electrical conductivity could not be performed.

(8-4) Evaluation Results

As for the inventive examples 1 to 3, a list of the results of the sheet forming evaluation, the sheet appearance evaluation and the electrical conductivity evaluation are shown in Table 5. As for the inventive examples 4 to 6, a list of the results of the sheet forming evaluation, the sheet appearance evaluation and the electrical conductivity evaluation are shown in Table 6. As for the comparative examples 1 to 3, a list of the results of the sheet forming evaluation, the sheet appearance evaluation and the electrical conductivity evaluation are shown in Table 7. As for the comparative examples 4 to 6, a list of the results of the sheet forming evaluation, the sheet appearance evaluation and the electrical conductivity evaluation are shown in Table 8. Tables 5 to 8 further show the resistance values that are measured in the electrical conductivity evaluation.

TABLE 5

|  | INVENTIVE EXAMPLE 1 | INVENTIVE EXAMPLE 2 | INVENTIVE EXAMPLE 3 |
|---|---|---|---|
| RESULT OF SHEET FORM EVALUATION | ○ | ○ | ○ |
| RESULT OF SHEET APPEARANCE EVALUATION | ○ | ○ | ○ |
| RESISTANCE VALUE | 15 mΩ | 24 mΩ | 33 mΩ |
| RESULT OF ELECTRICAL CONDUCTIVITY EVALUATION | ⊚ | ⊚ | ⊚ |

TABLE 6

|  | INVENTIVE EXAMPLE 4 | INVENTIVE EXAMPLE 5 | INVENTIVE EXAMPLE 6 |
|---|---|---|---|
| RESULT OF SHEET FORM EVALUATION | ○ | ○ | ○ |
| RESULT OF SHEET APPEARANCE EVALUATION | ○ | ○ | ○ |
| RESISTANCE VALUE | 124 mΩ | 12 mΩ | 9 mΩ |
| RESULT OF ELECTRICAL CONDUCTIVITY EVALUATION | ○ | ⊚ | ⊚ |

TABLE 7

|  | COMPARATIVE EXAMPLE 1 | COMPARATIVE EXAMPLE 2 | COMPARATIVE EXAMPLE 3 |
|---|---|---|---|
| RESULT OF SHEET FORM EVALUATION | ○ | ○ | ○ |
| RESULT OF SHEET APPEARANCE EVALUATION | ○ | ○ | ○ |
| RESISTANCE VALUE | 230 mΩ | 210 mΩ | 205 mΩ |
| RESULT OF ELECTRICAL CONDUCTIVITY EVALUATION | X | X | X |

TABLE 8

|  | COMPARATIVE EXAMPLE 4 | COMPARATIVE EXAMPLE 5 | COMPARATIVE EXAMPLE 6 |
|---|---|---|---|
| RESULT OF SHEET FORM EVALUATION | X | ○ | ○ |
| RESULT OF SHEET APPEARANCE EVALUATION | ○ | ○ | X |
| RESISTANCE VALUE | — | 240 mΩ | 225 mΩ |
| RESULT OF ELECTRICAL CONDUCTIVITY EVALUATION | X | X | X |

In the list of the results of the sheet forming evaluation shown in Tables 5 to 8, "○" indicates that the sheet shape is maintained and an "X" indicates that the sheet shape is not maintained.

In the list of the results of the sheet appearance evaluation shown in Tables 5 to 8, "○" indicates that the surface of the conductive composition is smooth, and "X" indicates that a projection is observed on the surface of the conductive composition.

In the list of the results of the electrical conductivity evaluation in Tables 5 to 8, "⊚" indicates that the resistance value is not more than 50 mΩ, "○" indicates that the resistance value is not less than 50 mΩ and not more than 150 mΩ and "X" indicates that the resistance value is larger than 150 mΩ.

According to the results of the sheet forming evaluation, the sheet shape was not maintained only in the conductive composition sheet of the comparative example 4. The conductive composition used in the comparative example 4 did not include the elastomer. Therefore, in the conductive composition, it was understood that the conductive composition could be formed into a sheet shape and the sheet shape could be maintained by adding the elastomer even if the thermosetting resin was not cured.

According to the results of the sheet appearance evaluation, the projections were only observed on the surface of the conductive composition sheet of the comparative example 6. The average particle diameter of the spherical graphite contained in the conductive composition of the comparative example 6 was larger than the average particle diameter of the spherical graphite added in another conductive composition and was larger than 30 µm. Thus, in the conductive composition, it was understood that the surface could be made smooth by setting the average particle diameter of the spherical graphite to not more than 30 µm.

According to the results of the electrical conductivity evaluation, the electrical conductivity in the thickness direction of the samples of the comparative examples 1 to 3, 5 and 6 were all more than 150 mΩ. Further, the sample of the comparative example 4 could not be fabricated. On the other hand, the electrical conductivity of the samples of the inventive examples 1 to 6 was not more than 150 mΩ, and the samples of the inventive examples 1 to 6 had the sufficient electrical conductivity. In particular, the electrical conductivity of the samples of the inventive examples 1 to 3, 5 and 6 was not more than 50 mΩ, and the inventive examples 1 to 3, 5 and 6 had even more sufficient electrical conductivity.

As a result, it was understood that the electrical conductivity in the thickness direction of the conductive composition sheet was improved by setting the respective content of the spherical graphite, the carbon black, the epoxy resin, the phenol resin and the elastomer in the mixture as shown in the embodiment described above.

I claim:

1. A conductive composition including a mixture of:
   spherical graphite;
   carbon black; and
   binder resin, wherein
   said mixture contains said spherical graphite of not less than 50 parts by weight and not more than 70 parts by weight, said carbon black of not less than 1 part by weight and not more than 15 parts by weight and said binder resin of not less than 15 parts by weight and not more than 40 parts by weight, to 100 parts by weight of the mixture, and
   said binder resin includes thermosetting resin and elastomer, and
   an average particle diameter of said spherical graphite is not less than 1 µm and not more than 30 µm.

2. The conductive composition according to claim 1, wherein
   said binder resin contains said thermosetting resin of not less than 5 parts by weight and not more than 95 parts by weight and said elastomer of not less than 1 part by weight and not more than 90 parts by weight, to 100 parts by weight of the binder resin.

3. The conductive composition according to claim 1, wherein
   said thermosetting resin includes at least one of epoxy resin and phenol resin.

4. A conductive substrate comprising:
   a metal layer; and
   a layer that is formed on at least one surface of said metal layer and is made of the conductive composition according to claim 1.

5. A conductive composition sheet that is formed of the conductive composition according to claim 1.

6. A conductive substrate comprising:
   a metal layer; and
   the conductive composition sheet according to claim 5 that is formed on at least one surface of said metal layer.

7. A collector sheet comprising:
   a metal layer having a predetermined pattern; and
   the conductive composition sheet according to claim 5 that is formed on at least one surface of said metal layer.

8. A printed circuit board comprising:
   an insulating layer;
   a conductor layer that is formed on said insulating layer and has a predetermined pattern; and
   a cover layer that is formed so as to cover at least part of a surface of said conductor layer, wherein
   said cover layer includes the conductive composition sheet according to claim 5.

9. A fuel cell comprising:
   the collector sheet according to claim 7;
   a cell element; and
   a casing that stores said collector sheet and said cell element, wherein
   said collector sheet has an opening.

10. A fuel cell comprising:
    the printed circuit board according to claim 8;
    a cell element; and
    a casing that stores said printed circuit board and said cell element, wherein
    said printed circuit board has an opening.

11. A method of manufacturing a conductive composition using a mixture that includes spherical graphite, comprising the steps of:
    producing 100 parts by weight of the mixture of the spherical graphite, carbon black and binding resin, the mixture containing the spherical graphite having an average particle diameter of not less than 1 µm and not more than 30 µm of not less than 50 parts by weight and not more than 70 parts by weight, the carbon black of not less than 1 part by weight and not more than 15 parts by weight and the binder resin including thermosetting resin and elastomer of not less than 15 parts by weight and not more than 40 parts by weight; and
    heating said mixture to a temperature higher than the temperature at which said thermosetting resin is cured.

12. The method of manufacturing the conductive composition according to claim 11, further comprising the step of:
    forming said mixture into a sheet shape while heating said mixture to a temperature lower than the temperature at which said thermosetting resin is cured before heating said mixture to the temperature higher than the temperature at which said thermosetting resin is cured.

* * * * *